(12) United States Patent
St. John et al.

(10) Patent No.: US 7,085,915 B1
(45) Date of Patent: Aug. 1, 2006

(54) PROGRAMMABLE PREFETCHING OF INSTRUCTIONS FOR A PROCESSOR EXECUTING A NON-PROCEDURAL PROGRAM

(75) Inventors: Robert W. St. John, Hyde Park, NY (US); Joseph L. Temple, III, Hurley, NY (US)

(73) Assignee: International Business Machines Corporation, Armonk, NY (US)

( * ) Notice: Subject to any disclaimer, the term of this patent is extended or adjusted under 35 U.S.C. 154(b) by 904 days.

(21) Appl. No.: 09/515,432

(22) Filed: Feb. 29, 2000

(51) Int. Cl.
*G06F 9/44* (2006.01)
*G06F 9/30* (2006.01)
*G06F 9/40* (2006.01)

(52) U.S. Cl. .................................................. 712/205

(58) Field of Classification Search ................ 712/207, 712/205; 711/213, 237
See application file for complete search history.

(56) References Cited

U.S. PATENT DOCUMENTS

| | | | | |
|---|---|---|---|---|
| 3,551,895 A | * | 12/1970 | Driscoll ...................... | 712/237 |
| 3,573,854 A | * | 4/1971 | Watson et al. ............... | 712/237 |
| 3,577,189 A | * | 5/1971 | Cocke et al. ................ | 712/219 |
| 4,561,052 A | * | 12/1985 | Tateno ......................... | 712/207 |
| 4,714,994 A | | 12/1987 | Oklobdzija et al. ......... | 364/200 |
| 4,764,861 A | | 8/1988 | Shibuya ....................... | 364/200 |
| 4,853,840 A | | 8/1989 | Shibuya ....................... | 364/200 |
| 4,881,170 A | | 11/1989 | Morisada .................... | 364/200 |
| 4,984,154 A | | 1/1991 | Hanatani et al. ............ | 364/200 |
| 5,168,557 A | | 12/1992 | Shibuya ....................... | 395/375 |
| 5,317,702 A | | 5/1994 | Morisada .................... | 365/375 |
| 5,394,530 A | | 2/1995 | Kitta ........................... | 395/375 |
| 5,404,467 A | | 4/1995 | Saba et al. .................. | 395/375 |
| 5,606,682 A | | 2/1997 | McGarity .................... | 385/414 |
| 5,615,386 A | * | 3/1997 | Amerson et al. ........... | 712/238 |

(Continued)

FOREIGN PATENT DOCUMENTS

EP 00689131 A1 * 12/1995

OTHER PUBLICATIONS

Lilja, David J.; Reducing the Branch Penalty in Pipelined Processors; Jul. 1998; IEEE Computer; pp. 47-55.*

(Continued)

*Primary Examiner*—Jason Cardone
*Assistant Examiner*—Jeffrey R. Swearingen
(74) *Attorney, Agent, or Firm*—Lily Neff, Esq.; Kevin P. Radigan, Esq.; Heslin Rothenberg Farley & Mesiti P.C.

(57) ABSTRACT

A programmable prefetch mechanism is presented for prefetching instructions for a processor executing a program, and in particular a non-procedural program such as object-oriented code. The prefetch mechanism includes prefetching instructions from memory which are sequential instructions from where the processor is currently executing in a sequence of instructions of the program, and when the prefetching encounters a new update prefetch stream (UPS) instruction, the prefetching includes executing the UPS instruction and subsequent thereto, branching to a new memory address for prefetching of at least one non-sequential instruction from memory for execution by the processor. The UPS instruction can be inserted into the program at compile time and when executed causes the loading of a prefetch buffer in the prefetch mechanism which in one embodiment includes a set associative array of x,y address pairs. When an incremented prefetch address is matched to an x address of the array, the prefetching branches to the new memory address y paired with the matching x address in the prefetch buffer. In this manner, cache misses associated with unconditional branches to non-sequential instructions are avoided.

27 Claims, 5 Drawing Sheets

U.S. PATENT DOCUMENTS 5,729,707 A * 3/1998 Maki .......................... 712/207
5,961,637 A * 10/1999 Sturges et al. .............. 712/235

OTHER PUBLICATIONS

Hennessy, John L. and David A. Patterson; Computer Architecture: A Quantitative Approach, 2ed.; Morgan Kaufmann Publishers, Inc; 1996; pp. 375-380.*

Alfonseca, Manuel, "Object-Oriented Programming Tutorial", ACM Special Interest Group on APL Programming Language, 1990, pp. 7-8.*

Cohen, Jacques, "A View of the Origins and Development of Prolog", Communications of the ACM, vol. 31, Issue 1, Jan. 1998, pp. 26-36.*

* cited by examiner fig. 1 fig. 2 fig. 3 fig. 4
PRIOR ART fig. 5

UPS, R2, DISP fig. 8 fig. 6 fig. 7

PROGRAMMABLE PREFETCHING OF INSTRUCTIONS FOR A PROCESSOR EXECUTING A NON-PROCEDURAL PROGRAM

TECHNICAL FIELD

This invention relates in general to instruction prefetching for use in a data or information processing system, and more particularly, to a programmable prefetch mechanism for prefetching instructions for a processor executing a non-procedural program with an instruction sequence that includes one or more branch and link instructions to non-sequential instructions in memory.

BACKGROUND OF THE INVENTION

Modern computer architectures typically cache instructions in a dedicated instruction cache and have various mechanisms for loading the cache efficiently. Typically, these mechanisms involve "prefetching" instructions into the cache which are in the next sequential block from where the processor is currently executing. Branching interrupts this flow and history tables are conventionally used to determine the most likely branch to prefetch along. By way of example, reference U.S. Pat. Nos. 5,394,530, 5,317,702, and 5,168,557. These techniques work well for classically written, procedural programs which tend to have reasonable working sets and iterate "inner loops" of densely packed code.

For non-procedural programs, such as object-oriented code, there are many more unconditional branch and link operations which may or may not be iterated. Thus, object-oriented code typically suffers from degraded cache hit ratios and the classical next sequential block prefetch is often ineffective and may result in degradation of performance of the data processing system. An enhanced prefetch mechanism for prefetching instructions is therefore desirable for a processor executing a non-procedural program such as object-oriented code.

DISCLOSURE OF THE INVENTION

Briefly summarized, this invention comprises in one aspect a method for implementing prefetching of instructions for a processor executing a program. The method includes: prefetching instructions from memory which are sequential instructions from where the processor is currently executing in a sequence of instructions of the program; and wherein when the prefetching encounters an update prefetch stream (UPS) instruction, the prefetching includes executing the UPS instruction and subsequent thereto, branching to a new memory address for prefetching of at least one non-sequential instruction from memory for execution by the processor.

In another aspect, a system for implementing prefetching of instructions for a processor executing a program is provided. The system includes prefetch logic for prefetching instructions from memory which are sequential instructions from where the processor is currently executing in a sequence of instructions of the program. The prefetch logic includes means for executing an update prefetch stream (UPS) instruction when encountered, and subsequent thereto, for branching to a new memory address for prefetching of at least one non-sequential instruction from memory for execution by the processor.

In a further aspect, the invention includes at least one program storage device readable by a machine, tangibly embodying at least one program of instructions executable by the machine to perform a method for implementing prefetching of instructions for a processor executing a program. The method includes: prefetching instructions from memory which are sequential instructions from where the processor is currently executing in a sequence of instructions of the program; and wherein when the prefetching encounters an update prefetch stream (UPS) instruction, the prefetching comprises executing the UPS instruction and subsequent thereto, branching to a new memory address for prefetching of at least one non-sequential instruction from memory for execution by the processor.

To restate, provided herein is a novel programmable prefetch mechanism for prefetching instructions for a processor executing a program, and in particular, a non-procedural program such as object-oriented code. A new instruction, herein referred to as an update prefetch stream (UPS) instruction is compiled into the program preferably at least several instructions before an unconditional branch and link instruction, for example, where code of a first object calls code of a second object. The UPS instruction causes loading of an x,y address pair into a prefetch buffer provided with the processor's prefetch logic. When an incremented prefetch address matches an x address of the x,y address pairs loaded into the prefetch buffer, the corresponding new memory address y is substituted for the incremented prefetch address, thereby effecting the jump in memory address prefetching.

Among the advantages provided by the above-summarized prefetch mechanism, there is no reliance on a run-time history table as in most conventional approaches. The mechanism of the present invention works to predict a "call path" thereby improving the prefetch operation even when there is little locality of reference either from sequential execution or "tight loops". The prefetch mechanism presented herein improves the hit ratio of instruction caches by removing inaccurate prefetches, while not eliminating prefetching when presented with an unconditional branch and link instruction. Prefetching in accordance with the principles of the present invention allows fetching of instructions into an instruction cache, thereby allowing other fetching mechanisms between the cache and processor to operate in a normal manner, and more particularly, affords such mechanisms a higher hit rate of the desired instruction in the cache.

BRIEF DESCRIPTION OF THE DRAWINGS

The above-described objects, advantages and features of the present invention, as well as others, will be more readily understood from the following detailed description of certain preferred embodiments of the invention, when considered in conjunction with the accompanying drawings in which.

BEST MODE FOR CARRYING OUT THE INVENTION

In accordance with the principles of the present invention, a programmable prefetch capability is provided for prefetching instructions for a processor executing a non-procedural program, such as a program written in object-oriented language. The prefetch mechanism decodes and executes a new instruction call, herein referred to as an update prefetch stream (UPS) instruction. Execution of a UPS instruction generates and translates an address which is then inserted into the prefetch counter. the object-oriented compiler preferably inserts the UPS instruction into the program code at least several instructions before an unconditional "branch and link" to a new object located in memory at a non-sequential address to a current object being executed. The prefetch capability presented improves the cache hit ratio by trading off processing time associated with the addition of a UPS instruction and its execution.

Figure 1:
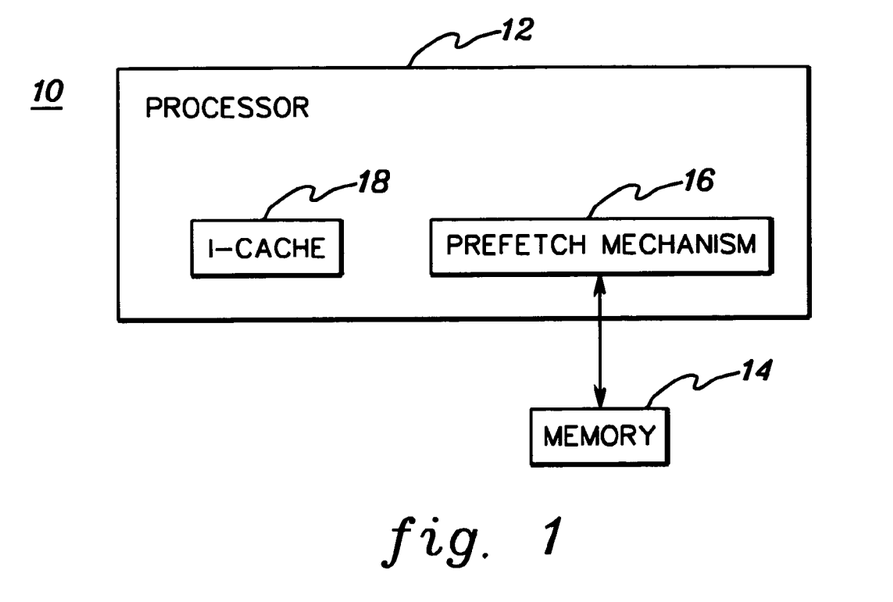
FIG. 1 is one example of a block diagram of a data processing system incorporating a programmable prefetch mechanism in accordance with the principles of the present invention.

One example of a computing environment incorporating and using the prefetch capability of the present invention is depicted in FIG. 1 and described below.

Referring to FIG. 1, a computer environment 10 includes, for instance, a computing unit or processor 12 and memory 14. As is known, processor 12 is the controlling center of the computer environment and includes the sequencing and processing facilities for instruction execution, interruption action, timing functions, initial program loading and other machine related functions. The processor executes at least one operating system, which as known, is used to control the operation of the computing unit by controlling the execution of other programs, controlling communication with peripheral devices and controlling use of the computer resources. Processor 12 is coupled to memory 14 which is directly addressable and provides for high speed processing of data by the processor. Relevant to the present invention, processor 12 includes a prefetch mechanism 16 and an associated instruction cache (i-cache) 18. The prefetch mechanism 16 prefetches instructions from memory 14 for placement into i-cache 18 for execution by processor 12.

In one example, computer environment 10 is a single system environment, which includes an S/390 computer system running an OS/390 operating system. (S/390 and OS/390 are offered by International Business Machines Corporation.) The invention is not limited to such an environment, however. The capabilities of the present invention can be incorporated and used within many types of computer environments and many types of computer systems, all of which are considered a part of the claimed invention.

Figure 2:
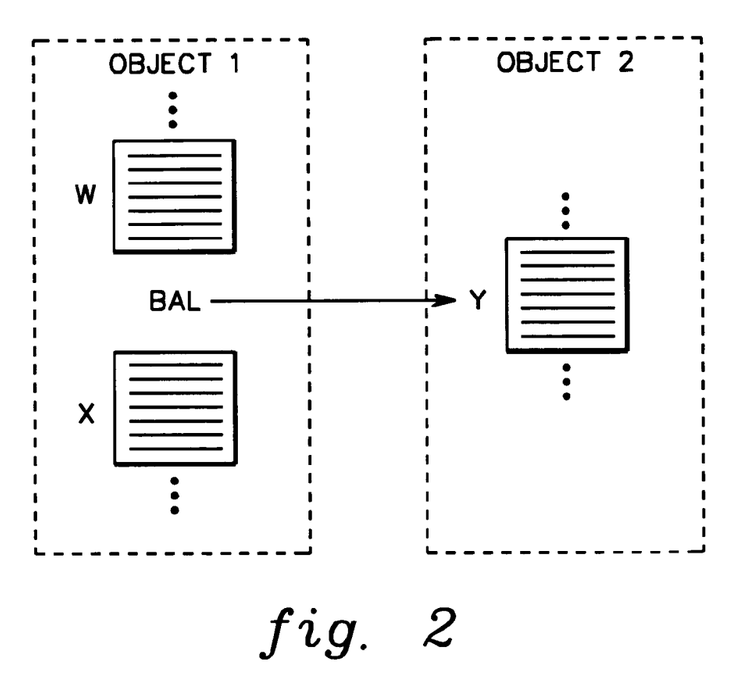
FIG. 2 depicts one embodiment of an object-oriented program with an unconditional branch and link instruction from a first object to a second object to be addressed during prefetching in accordance with the principles of the present invention.

Although discussed hereinbelow with reference to object-oriented code, the prefetch facility described can be employed with any program code, but is particularly advantageous when used in connection with non-procedural code. FIG. 2 depicts an object 1 and object 2 of an objected-oriented program to be prefetched in accordance with the principles of the present invention. Many calls in an object-oriented program result in unconditional branches, herein referred to as "branch and link" (BAL) instructions. Existing art is principally concerned with conditional branches which require prefetching both block x and block y of instructions, and speculatively executing one based on history tables. Further, existing prefetchers typically will prefetch block x of instructions even though it is never executed after the BAL instruction. Since block y of instructions bears little locality relationship in memory to currently executing block w of object 1, prefetching it becomes important to processor performance. The increase calls to prefetch y make it desirable to prevent block x from being prefetched and taking up i-cache space. As used herein, instructions within object 1 comprise a piece of code or a procedural method wherein instructions are typically stored sequentially within memory. Instructions within object 2, for example, within instruction block y, would typically be stored in a different address within memory and therefore comprise non-sequential instructions to those executing in object 1.

Figure 3:
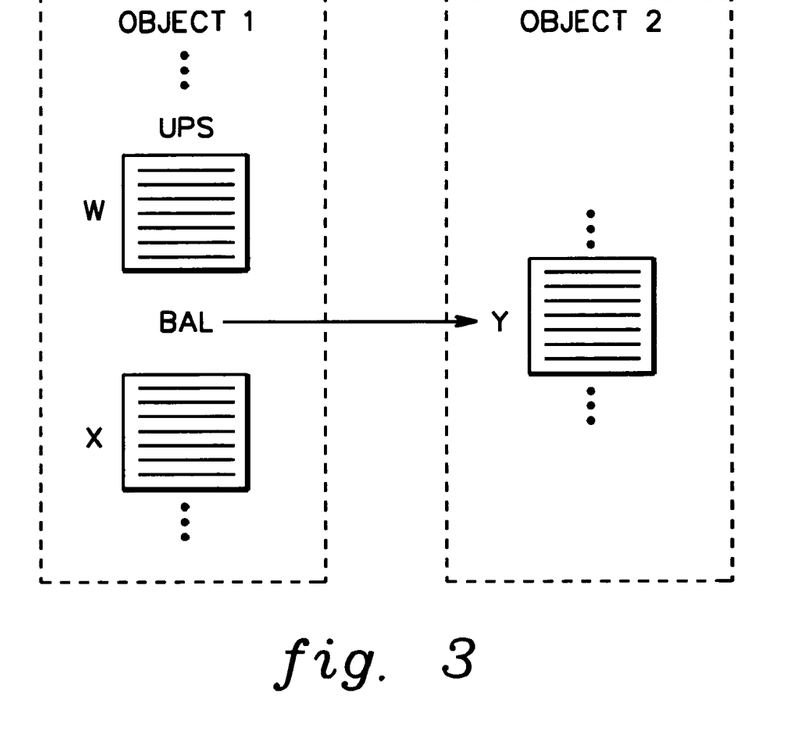
FIG. 3 depicts the object-oriented program of FIG. 2, with an update prefetch stream (UPS) instruction inserted into the first object in accordance with the principles of the present invention.

In accordance with the principles of the present invention, the program compiler is readily modified to provide it with intelligence on where to place a UPS instruction. In FIG. 3, the UPS instruction is shown to be before block w of instructions, however, could be located anywhere prior to the BAL instruction, but preferably at least several instructions before the BAL instruction to provide the prefetcher with time to retrieve the non-sequential instructions (for example, instructions in block y of object 2 shown in FIG. 3). As explained further below, the UPS instruction presented herein tells the prefetch mechanism that when it gets to, for example, code x of object 1, it should instead branch prefetching to block y of object 2.

The UPS instruction should be compiled with the code at such a point that the prefetch mechanism will start prefetching at the alternate location, for example, block y in object 2, before the prefetch mechanism would have started prefetching block x in object 1 following the unconditional BAL instruction. In one example, code w, x and y comprise cache lines and the UPS instruction should be disposed at a point in the compiled code where the prefetcher will jump to prefetching cache line y before beginning prefetching of cache line x. Where in the instruction code the UPS instruction belongs for the designated BAL depends upon the size of the cache line for the particular machine the program is executing.

Insertion of the UPS instruction at compile time can be readily accomplished by one skilled in the art. For example, a flag, parameter, or directive can be manually inserted into the source code identifying mainstream procedure, object method or subroutine calls. As the compile and link edit proceed, the compiler inserts a UPS instruction(s) at the beginning of procedures, object methods or subroutines which contain mainstream calls. As the branch and link (BAL) instructions are generated for mainstream calls, the x and y operands for the UPS instructions are also generated, located and loaded into the operand locations.

Alternatively, the manual insertion of mainstream directives could be automated by tracing actual or simulated execution of the program in question and noting the calls most frequently made as mainstream. The back linkage from the execution path to source code calls can be made using well known debugger technologies which are available to show the assembler and the source being executed as the program is stopped or stopped on condition. Since a program can identify the source call, a program can insert the directives.

Figure 4:
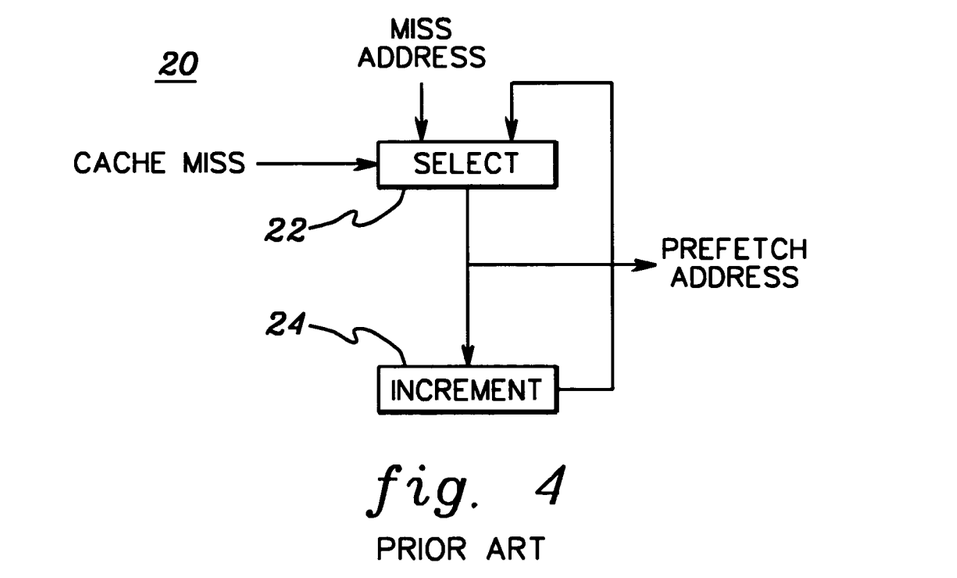
FIG. 4 is a diagram of a prior art prefetch mechanism.

FIG. 4 is a block diagram of one embodiment of an existing prefetch mechanism, generally denoted 20. In this embodiment, select logic 22 receives as input either an incremented prefetch address from incrementer 24 or a miss address indicating where the processor is going. The instruction cache provides a cache miss signal to the select logic 22 to select between the miss address input and the incremented prefetch address. Output from select logic 22 is the prefetch address which is used to prefetch a next block of instructions, or cache line, from memory for placement in the instruction cache. At each actual cache miss a new prefetch location is loaded through the miss address, and the prefetcher increments the miss address and fetches the next cache line, ideally before it is referenced by the processor.

Figure 5:
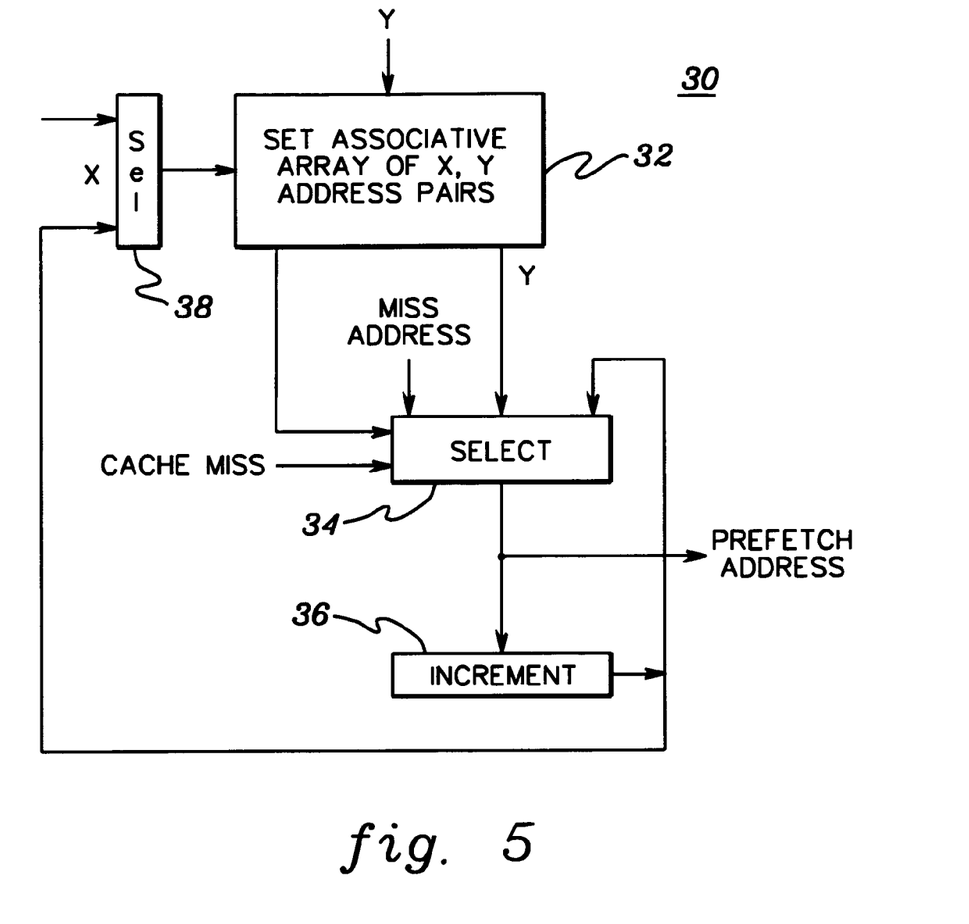
FIG. 5 is a diagram of one embodiment of a programmable prefetch mechanism in accordance with the principles of the present invention.

FIG. 5 depicts one embodiment of a prefetch mechanism, generally denoted 30, in accordance with the principles of the present invention. In this embodiment, prefetch mechanism 30 includes a set associative array of x,y address pairs 32 which provides a y address to select logic 34 whenever the incremented prefetch address matches the paired x address as explained further below. Select logic 34 further receives as input a miss address from the processor and the incremented prefetch address from an incrementer 36. Control lines to select logic 34 include the cache miss signal from the instruction cache, as well as a control signal from the set associative array of x,y address pairs 32. Addressing to the array of address pairs is through select logic 38 which has as input the incremented prefetch address returned from incrementer 36, as well as x address operands of the UPS instruction loads for the x,y address pairs. Within the set associative array of x,y address pairs, a first portion of address x, for example, 3 or 4 bits, can be used as a random access memory (RAM) address into the array, and the remaining bits could be stored, along with the y prefetch address in the RAM. Each incremented prefetch address is then compared with the x address stored in the array and when a match is found, the y prefetch address is output to the select logic, and the select logic is signaled to select the y prefetch address.

In operation, the new prefetch mechanism of the present invention attempts to fetch a new stream of instructions y before a cache miss occurs by using a set of address pairs to guide its behavior. The address pairs are held in a buffer within the prefetch mechanism and are loaded by the execution of a new UPS instruction. The array of address pairs is then continuously checked for a match between the incremented prefetch address and the x address of the address pairs. When a match occurs, the y address of the x,y address pair is used instead of the incremented prefetch address.

Note that in one implementation a single UPS instruction could load a block of address pairs into the set associative array of address pairs. For example, a single UPS instruction could load all address pairs for a given object. The UPS instruction essentially comprises a link between the compiler of the object-oriented code and the prefetch hardware mechanism described herein. As noted above, the compiler generates the address pairs to be loaded into the buffer and inserts the UPS instruction into the code where appropriate.

Figure 6:
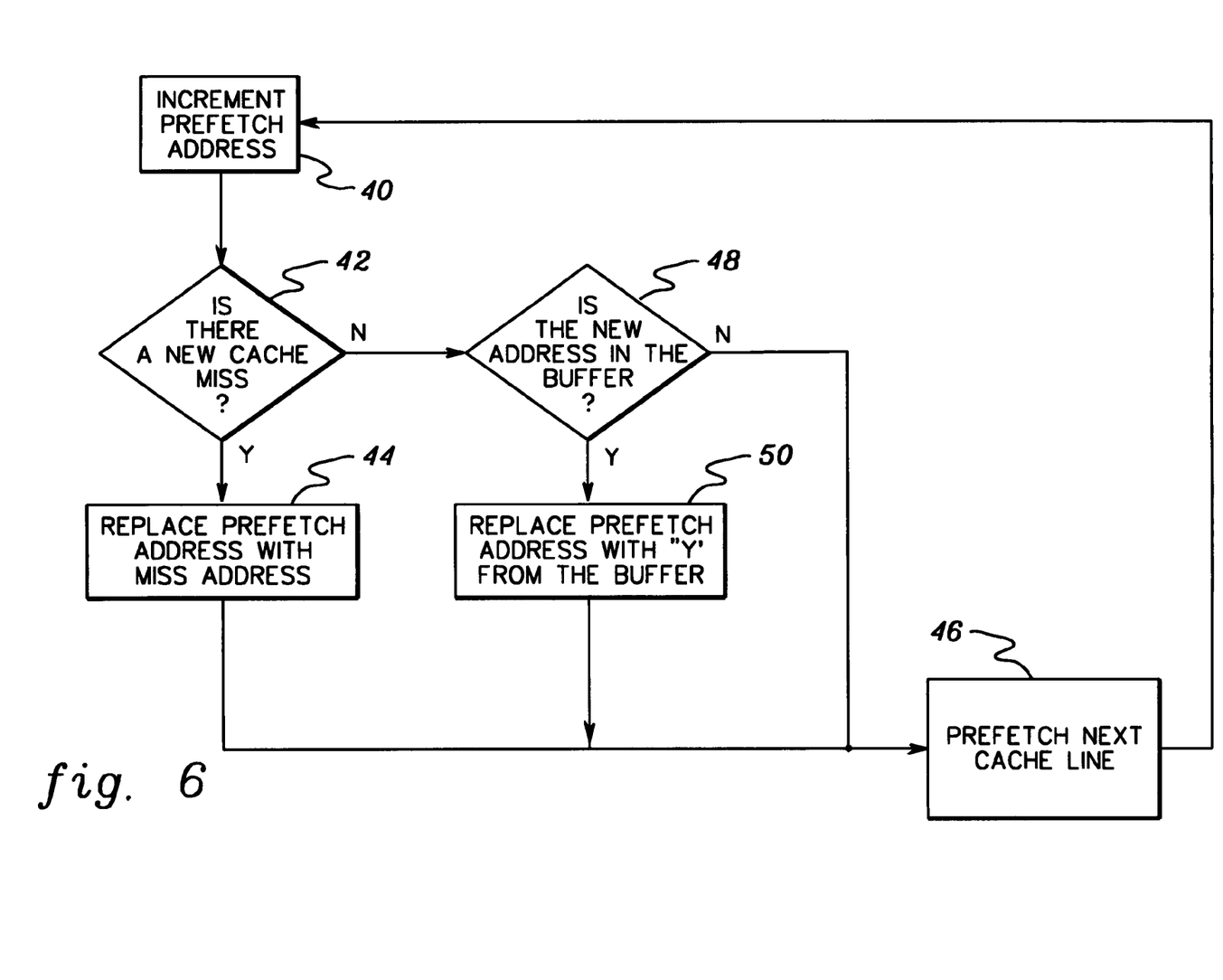
FIG. 6 is a flowchart of one embodiment of prefetch processing in accordance with the principles of the present invention.
Figure 7:
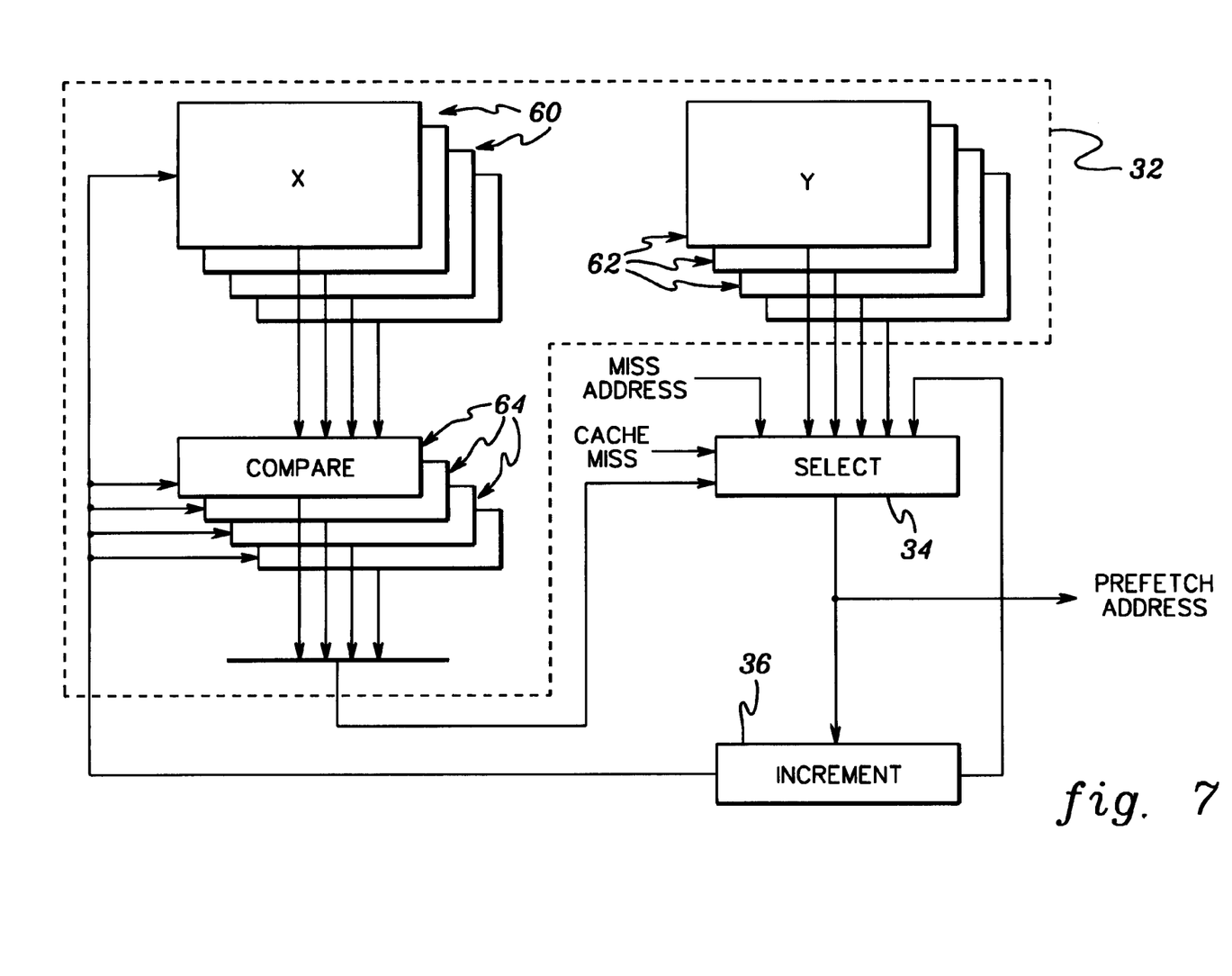
FIG. 7 is a diagram of one embodiment of a buffer of address pairs implemented within a programmable prefetch mechanism in accordance with the principles of the present invention.

FIG. 6 depicts a flowchart of one embodiment of prefetch logic employed by a prefetch mechanism in accordance with the principles of the present invention, while FIG. 7 depicts a more detailed embodiment of the set associative array of address pairs depicted in FIG. 5. Referring first to FIG. 6, the prefetch processing first increments the existing prefetch address 40 and then determines whether there is a new cache miss 42. Existing instruction caches will signal the prefetch mechanism when a cache miss has occurred. If yes, then the incremented prefetch address is replaced by the miss address received from the processor 44 and a next cache line from the cache miss is prefetched 46 and incremented 40.

In accordance with the present invention, if there is no new cache miss, then the prefetch processing determines whether the new, incremented prefetch address is in the prefetch buffer, i.e., the set associative array of address pairs 48. If no, then the incremented prefetch address is employed to prefetch the next cache line 46 and processing further increments the prefetch address 40. If the incremented prefetch address is within the set associative array of the prefetch buffer, then the incremented prefetched address is replaced by the "y" prefetch address loaded in the buffer 50 and is used to prefetch a next cache line 46 from memory. Thereafter, processing increments the employed prefetch address and continues as described above.

As noted, FIG. 7 depicts in greater detail one embodiment of a set associative structure 32 to be employed in accordance with the principles of the present invention. Within structures 32, x addresses 60 and y addresses 62 are paired, with the x address comprises an index into the array and when a match is found, the y address is to be output from the array for selection by select logic 34. Input to the array is the incremented prefetch address from incrementer 36. Compare logic 64 compares the incremented prefetch address with at least a portion of each x prefetch address 60 of the x,y address pairs. The outputs of the compare 64 are multiplexed into a control signal which is fed back to select logic 34. When instructed by compare logic 64, i.e., when the x address is matched with the incremented prefetch address, select logic 34 selects the corresponding y prefetch address of an x,y address pair.

Figure 8:
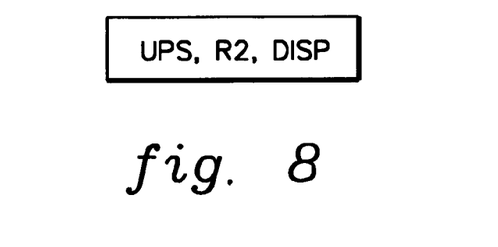
FIG. 8 is a depiction of one embodiment of a UPS instruction to be employed in accordance with the principles of the present invention.

FIG. 8 depicts one embodiment of a UPS instruction in accordance with the principles of the present invention. This instruction is used to load the UPS buffer (e.g., the set associative array of x,y address pairs). The instruction contains three fields, a first field, labeled UPS, comprises code that tells the hardware this is a UPS instruction. The second field, labeled R2, is an address register which is the source register in memory from which the address is to be calculated. The third field, labeled DISP, is an instruction format in assembler language that tells the prefetch mechanism the displacement from the source register where the prefetch address in memory can be found.

In one embodiment, up to one cache line can be moved to the UPS buffer with each UPS instruction. Thus, a 128-byte line could yield four address pairs in one example. The x and y addresses are stored as a pair of registers, a fully associative, or set associative array. The actual size of the array would be implementation dependent.

In one example, the compiler generates a UPS instruction based on the mainline identification for each called object which are meta code or compiler directives. The directives can be added by design or from trace data.

The present invention can be included, for example, in an article of manufacture (e.g., one or more computer program products) having, for instance, computer usable media. This media has embodied therein, for instance, computer readable program code means for providing and facilitating the capabilities of the present invention. The articles of manufacture can be included as part of the computer system or sold separately.

Additionally, at least one program storage device readable by machine, tangibly embodying at least one program of instructions executable by the machine, to perform the capabilities of the present invention, can be provided.

The flow diagrams depicted herein are provided by way of example. There may be variations to these diagrams or the steps (or operations) described herein without departing from the spirit of the invention. For instance, in certain cases, the steps may be performed in differing order, or steps may be added, deleted or modified. All of these variations are considered to comprise part of the present invention as recited in the appended claims.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method for implementing prefetching of instructions for a processor executing a non-procedural program, said method comprising:
   prefetching instructions into a cache from memory which are sequential instructions from where the processor is currently executing in a sequence of instructions of said non-procedural program; and
   wherein when said prefetching encounters an update prefetch stream instruction, said prefetching comprises executing said update prefetch stream instruction to load a block of address pairs into a set associative array of x,y address pairs in a prefetch buffer associated with prefetch logic performing the prefetching, the block of address pairs comprising multiple x,y address pairs, and subsequent thereto, changing a current prefetch address to a new memory prefetch address for prefetching of at least one non-sequential instruction from memory for loading into the cache, said changing comprising comparing a current prefetch address with each x address of the set of associative array of x,y address pairs, and if a match is found, changing to a new memory prefetch address y paired with the matching x address.

2. The method of claim 1, wherein said executing of said update prefetch stream instruction provides information to said prefetching on when to change to said new memory prefetch address.

3. The method of claim 1, wherein said prefetching comprises prefetching at least one block of instructions from memory, and wherein said at least one non-sequential instruction comprises at least one block of non-sequential instructions.

4. The method of claim 1, further comprising inserting said update prefetch stream instruction into said sequence of instructions at compile time for subsequent execution by said prefetching.

5. The method of claim 4, wherein said program comprises an object oriented program, and wherein execution of the update prefetch stream instruction loads all x,y address pairs for an object, wherein the object comprises the sequence of instructions.

6. The method of claim 5, wherein said sequence of instructions comprises a single thread of instructions.

7. The method of claim 1, wherein said prefetching instructions comprises with each prefetch, incrementing a current prefetch address to obtain an incremented prefetch address and comparing said incremented prefetch address with each x address of said set associative array of x,y address pairs.

8. The method of claim 7, further comprising determining whether a cache miss is signaled, and if so, replacing said incremented prefetch address with a cache miss address and incrementing said cache miss address to obtain a next incremented prefetch address.

9. The method of claim 8, further comprising implementing said prefetching in prefetch logic associated with a processor cache containing instructions for execution by said processor.

10. A system for implementing prefetching of instructions for a processor executing a non-procedural program, said system comprising:
    prefetch logic for prefetching instructions into a cache from memory which are sequential instructions from where the processor is currently executing in a sequence of instructions of the non-procedural program; and
    wherein said prefetch logic comprises means for executing an update prefetch stream instruction when encountered to load a block of address pairs into a set associative array of x,y address pairs in a prefetch buffer associated with prefetch logic performing the prefetching, the block of address pairs comprising multiple x,y address pairs, and subsequent thereto, changing a current prefetch address to a new memory prefetch address for prefetching of at least one non-sequential instruction from memory for loading into the cache, said changing comprising comparing a current prefetch address with each x address of the set of associative array of x,y address pairs, and if a match is found, changing to a new memory prefetch address y paired with the matching x address.

11. The system of claim 10, wherein said update prefetch stream instruction provides information to said prefetch logic on when to unconditionally change to said new memory prefetch address.

12. The system of claim 10, wherein said prefetch logic comprises means for prefetching at least one block of instructions from memory, and wherein said at least one non-sequential instruction comprises at least one block of non-sequential instructions.

13. The system of claim 10, further comprising said update prefetch stream instruction and means for inserting said update prefetch stream instruction into said sequence of instructions at compile time for subsequent execution by said prefetch logic.

14. The system of claim 13, wherein said program comprises an object-oriented program, and wherein execution of the update prefetch stream instruction loads all x,y address pairs for an object, wherein the object comprises the sequence of instructions.

15. The system of claim 14, wherein said sequence of instructions comprises a single thread of instructions.

16. The system of claim 10, wherein said prefetch logic comprises with each prefetch, means for incrementing a current prefetch address to obtain an incremented prefetch address and means for comparing said incremented prefetch address with each x address of said set associative array of x,y address pairs.

17. The system of claim 16, further comprising means for determining whether a cache miss is signaled, and if so, for replacing said incremented prefetch address with a cache miss address and for incrementing said cache miss address to obtain a next incremented prefetch address.

18. The system of claim 17, further comprising an instruction cache for holding instructions for execution by said processor, said prefetch logic being coupled to said instruction cache for loading prefetched instructions therein.

19. The system of claim 10, wherein said means for branching comprises means for branching to said new memory address to retrieve said at least one non-sequential instruction from memory for execution by said processor without initiating a cache miss.

20. At least one program storage device readable by a machine, tangibly embodying at least one program of instructions executable by the machine to perform a method for implementing prefetching of instructions for a processor executing a non-procedural program, said method comprising:

prefetching instructions into a cache from memory which are sequential instructions from where the processor is currently executing in a sequence of instructions of said non-procedural program; and wherein when said prefetching encounters an update prefetch stream instruction, said prefetching comprises executing said update prefetch stream instruction to load a block of address pairs into a set associative array of x,y address pairs in a prefetch buffer associated with prefetch logic performing the prefetching, the block of address pairs comprising multiple x,y address pairs, and subsequent thereto, changing a current prefetch address to a new memory prefetch address for prefetching of at least one non-sequential instruction from memory for loading into the cache, said changing comprising comparing a current prefetch address with each x address of the set of associative array of x,y address pairs, and if a match is found, changing to a new memory prefetch address y paired with the matching x address.

21. The at least one program storage device of claim 20, wherein said executing of said update prefetch stream instruction provides information to said prefetching on when to change to said new memory prefetch address.

22. The at least one program storage device of claim 20, wherein said prefetching comprises prefetching at least one block of instructions from memory, and wherein said at least one non-sequential instruction comprises at least one block of non-sequential instructions.

23. The at least one program storage device of claim 20, further comprising inserting said update prefetch stream instruction into said sequence of instructions at compile time for subsequent execution by said prefetching.

24. The at least one program storage device of claim 23, wherein said program comprises an object oriented program, and wherein execution of the update prefetch stream instruction loads all x,y address pairs for an object, wherein the object comprises the sequence of instructions.

25. The at least one program storage device of claim 24, wherein said sequence of instructions comprises a single thread of instructions.

26. The at least one program storage device of claim 20, wherein said prefetching instructions comprises with each prefetch, incrementing a current prefetch address to obtain an incremented prefetch address and comparing said incremented prefetch address with each x address of said set associative array of x,y address pairs.

27. The at least one program storage device of claim 26, further comprising determining whether a cache miss is signaled, and if so, replacing said incremented prefetch address with a cache miss address and incrementing said cache miss address to obtain a next incremented prefetch address.

\* \* \* \* \*